US 11,799,469 B2

(12) United States Patent
Sterna et al.

(10) Patent No.: US 11,799,469 B2
(45) Date of Patent: Oct. 24, 2023

(54) CONTROL OF TWO SERIES CONNECTED SWITCHES

(71) Applicant: Commissariat à l'Energie Atomique et aux Energies Alternatives, Paris (FR)

(72) Inventors: Léo Sterna, Grenoble (FR); Pierre Perichon, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 17/447,809

(22) Filed: Sep. 15, 2021

(65) Prior Publication Data

US 2022/0094350 A1      Mar. 24, 2022

(30) Foreign Application Priority Data

Sep. 18, 2020  (FR) ...................................... 2009484

(51) Int. Cl.
*H03K 17/13*      (2006.01)
*H01L 29/778*     (2006.01)
*H02M 1/08*       (2006.01)
*H03K 17/687*     (2006.01)

(52) U.S. Cl.
CPC ....... *H03K 17/133* (2013.01); *H01L 29/7786* (2013.01); *H02M 1/083* (2013.01); *H03K 2017/6875* (2013.01); *H03K 2217/0009* (2013.01)

(58) Field of Classification Search
None
See application file for complete search history.

(56) References Cited

U.S. PATENT DOCUMENTS

| 5,625,549 A * | 4/1997 | Horvat ................. H02M 7/219 363/132 |
| 2009/0027020 A1* | 1/2009 | Qiu ..................... H02M 3/1588 323/265 |
| 2011/0305054 A1 | 12/2011 | Yamagiwa et al. |
| 2019/0068071 A1* | 2/2019 | Jia ....................... H02M 3/3376 |
| 2019/0079552 A1* | 3/2019 | Yasusaka ................ G05F 1/461 |

FOREIGN PATENT DOCUMENTS

| CN | 110958004 A | 4/2020 |
| ES | 2317731 A1 | 4/2009 |
| JP | 3710468 B1 * | 10/2005 ............. G05F 1/575 |

OTHER PUBLICATIONS

Preliminary Search Report for French Application No. 2009484 dated May 26, 2021, 2 pages.

* cited by examiner

*Primary Examiner* — Daniel C Puentes
(74) *Attorney, Agent, or Firm* — Moreno IP Law LLC

(57) ABSTRACT

The present disclosure concerns a method and a circuit for controlling first and second switches electrically in series, wherein one or a plurality of crossings of a voltage threshold by a voltage across the first switch cause a conductive state of the second switch.

17 Claims, 4 Drawing Sheets

US 11,799,469 B2

CONTROL OF TWO SERIES CONNECTED SWITCHES

FIELD

The present disclosure generally concerns electronic devices, in particular, switched-mode converters.

BACKGROUND

Switched-mode converters use one or a plurality of switches alternately set to the on and off states at a switching frequency. Switched-mode converters are used to deliver a voltage and/or a current from a power supply having voltage/current values different from the values of the voltage/current to be delivered. For example, an AC/DC (alternating current-direct current) switched-mode converter enables to obtain a DC voltage from an AC voltage such as that of an electric network or of an alternator.

SUMMARY

There is a need to improve the operation of known switched-mode converters, in particular of known converters receiving and/or delivering an AC voltage.

There is a need to simplify the implementation of switches of known switched-mode converters, in particular known converters receiving and/or delivering an AC voltage.

There is a need to improve the efficiency and/or the reliability of known switched-mode converters.

An embodiment overcomes all or part of the disadvantages of known switch control methods.

An embodiment overcomes all or part of the disadvantages of known converters.

An embodiment enables to simplify the implementation of switches of known switched-mode converters, in particular of known converters receiving and/or delivering an AC voltage.

An embodiment enables to improve the efficiency and/or the reliability of known switched-mode converters, in particular known converters receiving and/or delivering an AC voltage.

An embodiment provides a method of controlling first and second switches electrically in series, said switches being field-effect transistors having interconnected source terminals, wherein:
one or a plurality of crossings of a first voltage threshold by a voltage across the first switch cause a conductive state of the second switch; and
one or a plurality of crossings of a second voltage threshold by a voltage across the second switch cause a conductive state of the first switch.

According to an embodiment, first periods of application of a square pulse control signal to the first switch and of conductive state of the second switch start by said crossings.

According to an embodiment, each square pulse of the control signal causes another crossing of the voltage threshold by the voltage across the first switch, and each first period ends a predefined delay after a last one of said other crossings located in the first period.

According to an embodiment, said conductive states of the second and first transistors short their respective intrinsic diodes.

According to an embodiment, each transistor is associated with a diode in antiparallel shorted during said conductive states.

According to an embodiment, second periods of application of the square pulse control signal to the second switch and of conductive state of the first switch start by said crossings of the second threshold.

According to an embodiment, each square pulse of the control signal causes another crossing of the second threshold by the voltage across the second switch, and each second period ends a predefined delay after a last one of said other crossings of the second threshold located in the second period.

According to an embodiment, the method provides, between the first periods and the second periods, third periods where the two switches are set to the off state.

According to an embodiment, said voltages across the first and second switches are referenced to their common source terminal, and the crossings are switchings from absolute values smaller than the first and second respective voltage thresholds to greater absolute values, said first and second threshold being preferably of same value.

According to an embodiment, the first and second switches comprise field-effect transistors, preferably of GaN HEMT type.

An embodiment provides a circuit configured to implement a described method.

According to an embodiment, the circuit comprises:
a first comparator receiving said voltage across the first switch and said first voltage threshold, and a logic circuit adapted to storing said one or a plurality of crossings and coupled to the comparator output; and
a second comparator receiving said voltage across the second switch and said second voltage threshold, and an additional logic circuit adapted to storing said one or a plurality of additional crossings and coupled to the output of the second comparator.

According to an embodiment, the circuit comprises:
a first monostable circuit having an input coupled to the output of said comparator; and
preferably, a second additional monostable circuit having an input coupled to the output of said second comparator.

According to an embodiment, the first monostable circuit comprises a flip-flop counter configured to receive the square pulse control signal on a clock input.

An embodiment provides a monolithic device comprising a circuit such as described and, preferably, the first and second switches.

An embodiment provides a switched-mode converter configured to receive and/or to deliver an AC voltage, comprising one or a plurality of circuits such as described or a device such as described.

An embodiment provides a method of controlling first and second switches electrically in series, wherein one or a plurality of crossings of a voltage threshold by a voltage across the first switch cause a conductive state of the second switch.

According to an embodiment, first periods of application of a square pulse control signal to the first switch and of conductive state of the second switch start by said crossings.

According to an embodiment, each square pulse of the control signal causes another crossing of the voltage threshold by the voltage across the first switch, and each first period ends a predefined delay after a last one of said other crossings located in the first period.

According to an embodiment, one or a plurality of additional crossings of an additional voltage threshold by an additional voltage across the second switch cause a conductive state of the first switch.

According to an embodiment, second periods of application of the square pulse control signal to the second switch and of conductive state of the first switch start by said additional crossings.

According to an embodiment, each square pulse of the control signal causes another additional crossing of the additional voltage threshold by the additional voltage across the second switch, and each second period ends a predefined delay after a last one of said other additional crossings located in the second period.

According to an embodiment, said voltage and/or said additional voltage are referenced to a terminal of series connection of the first and second switches, and the crossings are switchings from absolute values smaller than the voltage threshold to absolute values greater than the voltage threshold.

According to an embodiment, the circuit comprises:
a comparator receiving said voltage and the voltage threshold, and a logic circuit adapted to storing said one or a plurality of crossings and coupled to the comparator output; and
preferably, an additional comparator receiving said additional voltage and said additional voltage threshold, and an additional logic circuit adapted to storing said one or a plurality additional crossings and coupled to the output of the additional comparator.

According to an embodiment, the circuit comprises:
a monostable circuit having an input coupled to the output of said comparator; and
preferably, an additional monostable circuit having an input coupled to the output of said additional comparator.

An embodiment provides a monolithic device comprising a circuit such as described and, preferably, the first and second switches.

An embodiment provides a switched-mode converter configured to receive and/or deliver an AC voltage, comprising one or a plurality of circuits or a device such as described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, a driver circuit, also called close control circuit, provided to apply a control signal to a bidirectional switch (that is, to apply a voltage to a control electrode or control terminal such as a gate of a transistor forming the switch), is not described in detail, the described embodiments being compatible with usual driver circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
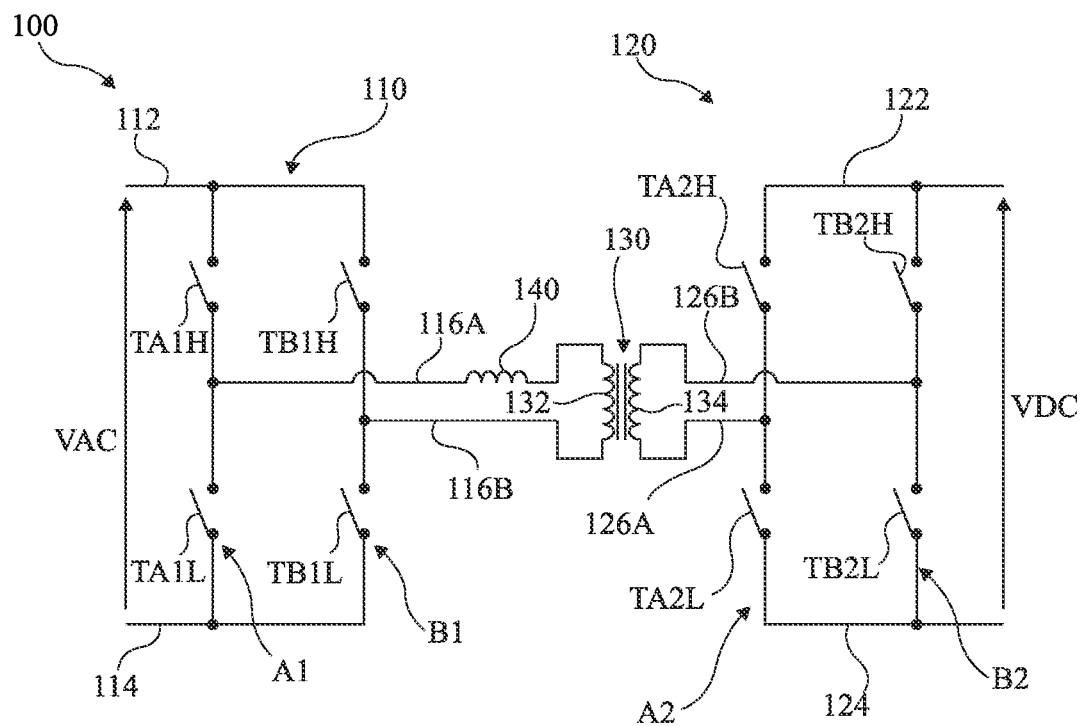
FIG. 1 schematically shows an example of a switched-mode converter of a type to which the described embodiments apply.

FIG. 1 schematically shows an example of a switched-mode converter 100 of a type to which the described embodiments apply. In this specific example, converter 100 is identical or similar to the converters described in patent application EP3346598 (B 15653-DD17624).

Converter 100 is an AC-DC-type converter receiving an AC voltage VAC and delivering a DC voltage VDC. In a typical application, AC voltage VAC originates from an electrical distribution network, and for example has a rms. voltage of approximately 110 V or of approximately 230 V, and for example a frequency equal to 60 Hz or 50 Hz. AC voltage VAC is thus preferably a high voltage, that is, having a peak value greater than 100 V, preferably greater than 150 V, for example, equal to approximately 155 V or to approximately 325 V.

DC voltage VDC is typically used to charge a battery, for example, a battery of a laptop computer or of a mobile distant communication device such as a cell phone. In an application, the DC voltage is delivered via a connection according to the universal serial bus USB standard, for example, of type C, preferably to the power delivery PD standard. DC voltage VDC is then 5 V, 12 V, or 20 V. The delivered power may then range up to 100 W. In other applications, DC voltage VDC powers equipment of a data center, such as microprocessors, mass memories, routers, etc. The DC voltage may then be 12 V, 24 V, or 48 V, and the power may be greater than 1 kW, for example, equal to approximately 1.5 kW or 3 kW. A plurality of converters may be arranged in parallel to deliver the same DC voltage.

Converter 100 comprises four switches TA1H, TA1L, TB1H, TB1L, for example identical to within manufacturing dispersions. Switches TA1H, TAIL, TB1H, TB1L are connected to form a first H bridge 110. The first H bridge 110 comprises two branches A1 and B1 coupling nodes 112 and 114 of application of AC voltage VAC. Branch A1 comprises switches TA1H and TAIL electrically in series between nodes 112 and 114. Branch B1 comprises switches TB1H and TB1L electrically in series between nodes 112 and 114.

Switches TA1H and TB1H are located on the side of node 112 and switches TA1L and TB1L are located on the side of node 114. H bridge 110 comprises a node 116A of connection between switches TA1H and TA1L and a node 116B of connection between switch TB1H and TB1L.

Converter 100 further comprises four switches TA2H, TA2L, TB2H, TB2L, for example identical to within manufacturing dispersions. Switches TA2H, TA2L, TB2H, TB2L are connected to form a second H bridge 120. Second H bridge 120 comprises two branches A2 and B2 coupling nodes 122 and 124 for delivering DC voltage VDC. Branch A2 comprises switches TA2H and TA2L electrically in series between nodes 122 and 124. Branch B2 comprises switches TB2H and TB2L electrically in series between nodes 122 and 124. Switches TA2H and TB2H are located on the side of node 122 and switches TA2L and TB2L are located on the side of node 124. H bridge 120 comprises a node 126A of connection between switches TA2H and TA2L and a node 126B of connection between switches TB2H and TB2L.

Converter 100 further comprises a transformer 130. Transformer 130 has a first winding 132 electrically in series with an inductance 140 between nodes 116A and 116B of first H bridge 110. Transformer 130 has a second winding 134 coupling, preferably connecting, nodes 126A and 126B of second H bridge 120. As a variant, first winding 132 connects nodes 116A and 116B and inductance 140 is in series with second winding 134 between nodes 126A and 126B. In another variant, inductance 140 represents a leakage inductance of transformer 130, that is, transformer 130 has a coupling coefficient smaller than 1.

In operation, the AC voltage successively takes positive (potential of node 112 greater than that of node 114) and negative (potential of node 112 smaller than that of node 114) values. To ensure this operation, switches TA1H, TA1L, TB1H, TB1L are bidirectional for the voltage. A switch bidirectional for the voltage is defined by a switch capable, in an off state, of preventing the flowing of a current for both directions, or signs, of the voltage across the switch.

Further, the current flowing through inductance 140 is also alternating. For this purpose, the switches are bidirectional for the current. A switch bidirectional for the current is defined by a switch capable, in a conductive state, of allowing the flowing of a current in both directions. Thus, switches TA1H, TA1L, TB1H, TB1L are bidirectional for the voltage and the current.

In an example of operation, at a switching frequency, in alternation, in alternation, bidirectional switches TA1H and TB1L are turned on and TB1H and TA1L are turned off, after which bidirectional switches TA1H and TB1L are turned off and TB1H and TA1L are turned on. In this example, each branch A1 and B1 is controlled as described hereafter in relation with FIG. 2. This example is not limiting, the described embodiments being compatible with usual methods of controlling switches of a switched-mode AC/DC converter. These usual methods for controlling the various switches of a converter, particularly bidirectional switches, to obtain by switching, for example, a DC voltage from an AC voltage, are not described in detail. The switching frequency is higher than that of the AC voltage, preferably greater than 1 MHz.

The above-described example of converter 100 is not limiting. In particular, the described embodiments are applicable to any converter similar to converter 100 intended to receive and/or deliver an AC voltage. The described embodiments are also applicable to any switched-mode converter, in particular to any converter intended to receive and/or deliver a voltage having different successive signs, preferably a single-phase or multiphase AC voltage. In particular, the embodiments are applicable to any converter comprising one or a plurality of branches between two nodes of application of the AC voltage. Each branch then comprises at least two switches in series. The branches typically deliver a current to an inductance internal to the converter. Preferably, these switches are bidirectional. Bidirectional means bidirectional for the current and/or the voltage.

Figure 2:
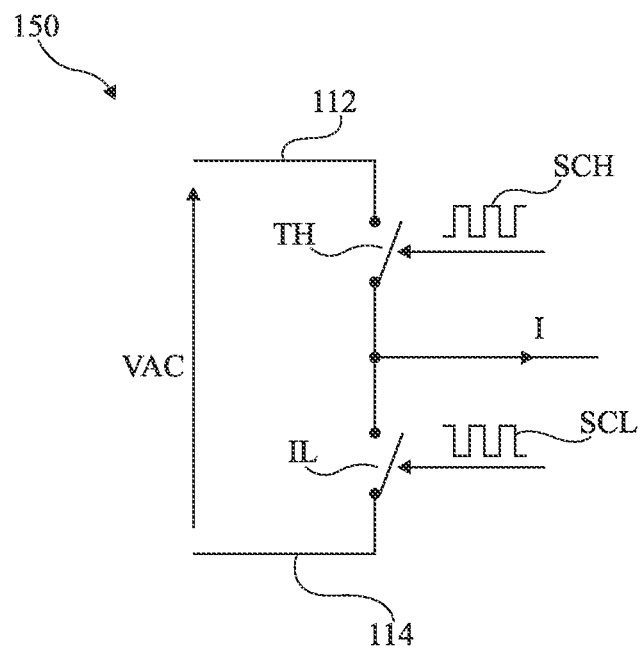
FIG. 2 partially and schematically shows an example of a branch of a switched-mode converter bridge, of a type to which the described embodiments apply.

FIG. 2 partially and schematically shows an example of a branch 150 of a switched-mode converter, of the type to which the described embodiments apply.

Branch 150 may form one and/or the other of the branches A1 and B1 of the example of converter 100 of FIG. 1. Thus, branch 150 comprises two bidirectional switches TH and TL in series between nodes 112 and 114. Bidirectional switches TH and TL may form the respective switches TA1H and TA1L or the respective switches TB1H and TB1L of the converter 100 of FIG. 1. This is not limiting, and branch 150 may be any association of two switches TH and TL electrically in series defining a switching cell of a converter receiving and/or delivering an AC voltage.

Switching cell means that the signals SCH and SCL for controlling the respective switches TH and TL are such that, when one of switches TH and TL is on, the other one of switches TH and TL is off. Thus, switches TH and TL are not simultaneously on. During the switching of the cell, the on and off states of switches TH and TL are exchanged.

Switches TH and TL may also be simultaneously turned off, in particular at each switching during so-called dead time periods. Preferably, to avoid power losses in switches TH and TL during switchings, at the end of each dead time, the setting to the conductive state of the concerned switch is performed when the voltage across this switch becomes zero, or becomes substantially zero as compared with the peak value of voltage VAC. Such switchings are called zero volt switchings ZVS. The embodiments are compatible with usual ZVS switching methods.

Switches TH and TL receive respective control signals SCH and SCL. Control signals SCH and SCL are typically square pulse signals. Square pulse signal means a signal comprising a succession of cycles, each cycle comprising a portion at a low level of the signal and a portion at a high level of the signal. The cycles of signals SCH and SCL may be repeated at the switching frequency.

Figure 3:
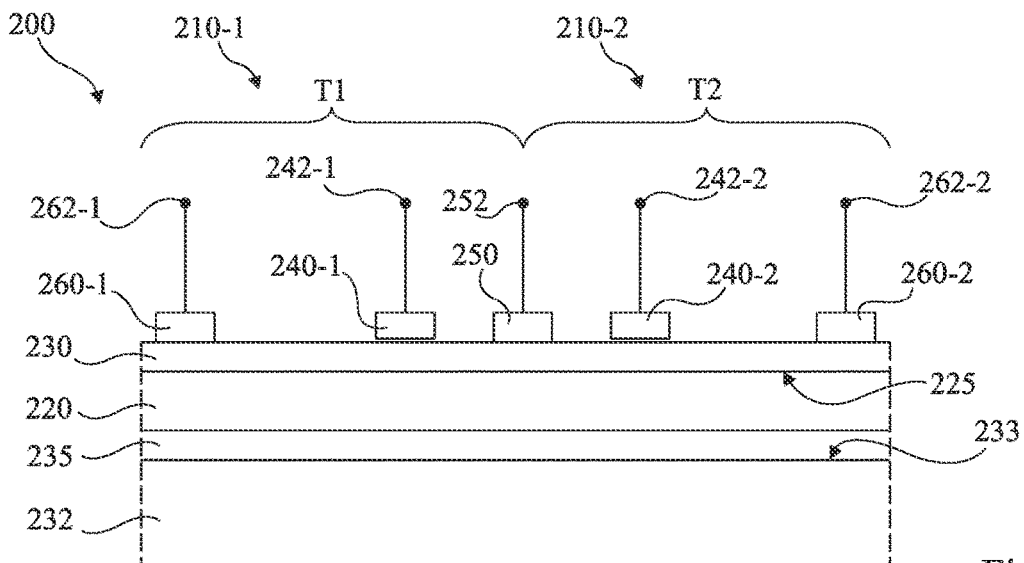
FIG. 3 shows, in a simplified cross-section view, an example of a bidirectional switch of a type to which the described embodiments apply.

FIG. 3 shows, in a simplified cross-section view, an example of a bidirectional switch 200 of a type to which the described embodiments apply. Bidirectional switch 200 may form any bidirectional switch of a switched-mode converter such as described in relation with FIG. 1, or any bidirectional switch of a switching cell. For example, the switches TA1H, TA1L, TB1H, and TB1L of the converter 100 of FIG. 1 are each identical or similar to bidirectional switch 200.

Bidirectional switch 200 comprises two switches 210-1 and 210-2 electrically in series. Preferably, switches 210-1 and 210-2 comprise respective field-effect transistors T1 and T2, preferably of the same type. Transistors T1 and T2 may be of any field-effect type. However, preferably, transistors T1 and T2 are of the shown type, called high electron mobility transistor, HEMT. Such transistors comprise two semiconductor layers 220 and 230 having different bandgaps, and defining together an interface 225 along which electrons are mobile (layer 230 covering layer 220). Such a transistor enables to block higher voltages and enables faster switchings than other types of field-effect transistors. More preferably, the semiconductors of layers 220 and 230 respectively are gallium nitride GaN and aluminum-gallium nitride AlGaN. It is then spoken of a GaN HEMT transistor.

Layers 220 and 230 typically rest on a support 232. Typically, support 232 comprises, or is formed of, a substrate formed of a semiconductor wafer portion, such as a silicon wafer. More precisely, layers 220 and 230 rest on a surface 233 of support 232 (upper surface in FIG. 2, also called front side). Support 232 may be covered with buffer layers 235, located between support 232 and layer 220, and intended to ease the forming of layer 220 on support 232. Various elements, such as insulating regions, as well as the materials other than those described hereabove, and dimensions such as the layer thicknesses, are not detailed herein, the described embodiments being compatible with usual GaN HEMT transistors.

Although, in the shown example, each switch 210-1, 210-2 comprises one transistor only, respectively T1, T2, switch 210-1 may comprise a plurality of transistors T1 electrically in parallel with one another, and switch 210-2 may comprise a plurality of transistors T2 electrically in parallel with one another.

Transistors T1 and T2 each comprise a gate, respectively 240-1, 240-2, and a drain region, respectively 260-1, 260-2. In the shown example, the gates and the drain regions are located on layer 230.

Transistors T1 and T2 each comprise a terminal, respectively 242 1, 242 2, coupled, preferably connected, to the respective gates 240 1 and 240 2. Terminals 242 1 and 242 2 form control terminals of the respective switches 210 1 and 210 2. Transistors T1 and T2 each comprise a terminal, respectively 262 1, 262 2 coupled, preferably connected, to the drain region, respectively 260 1, 260 2. Terminals 262 1, 262 2 form the conduction terminals of bidirectional switch 200.

Preferably, bidirectional switch 200 comprises a source terminal 252 common to transistors T1 and T2, connected to a source region 250 common to transistors T1 and T2. In the shown example, common source region 250 is located on layer 230. In each transistor T1, T2, the gate, respectively 240 1, 240 2, is located between the drain region, respectively 260 1, 260 2, and the common source region 250. In a variant, common source terminal 252 is coupled, for example, connected, to distinct source regions in transistors T1 and T2. In another variant, transistors T1 and T2 have distinct source terminals.

Each transistor T1, T2 is configured so that, when a positive voltage is applied between the drain and the source of the transistor, the on/off state of the transistor is controlled by the voltage between the gate and the source of the transistor. Thus, when the voltage takes high values such as defined hereabove, the most part of this voltage is between the drain and the gate.

Preferably, as shown, the structures of switches 210-1 and 210-2 formed by layers 220 and 230, gates 240 1, 240 2, and drain 260 1, 260 2 and source 250 regions, are symmetrical to each other with respect to a plane or with respect to an axis running through common source region 250. Symmetrical means symmetrical to within manufacturing dispersions. This enables, as compared with non-symmetrical switches 210-2 and 210-2, to more easily obtain inside and/or on top of a same support 232 a plurality of bidirectional switches 200 with a common source region having identical electric characteristics.

Figure 4:
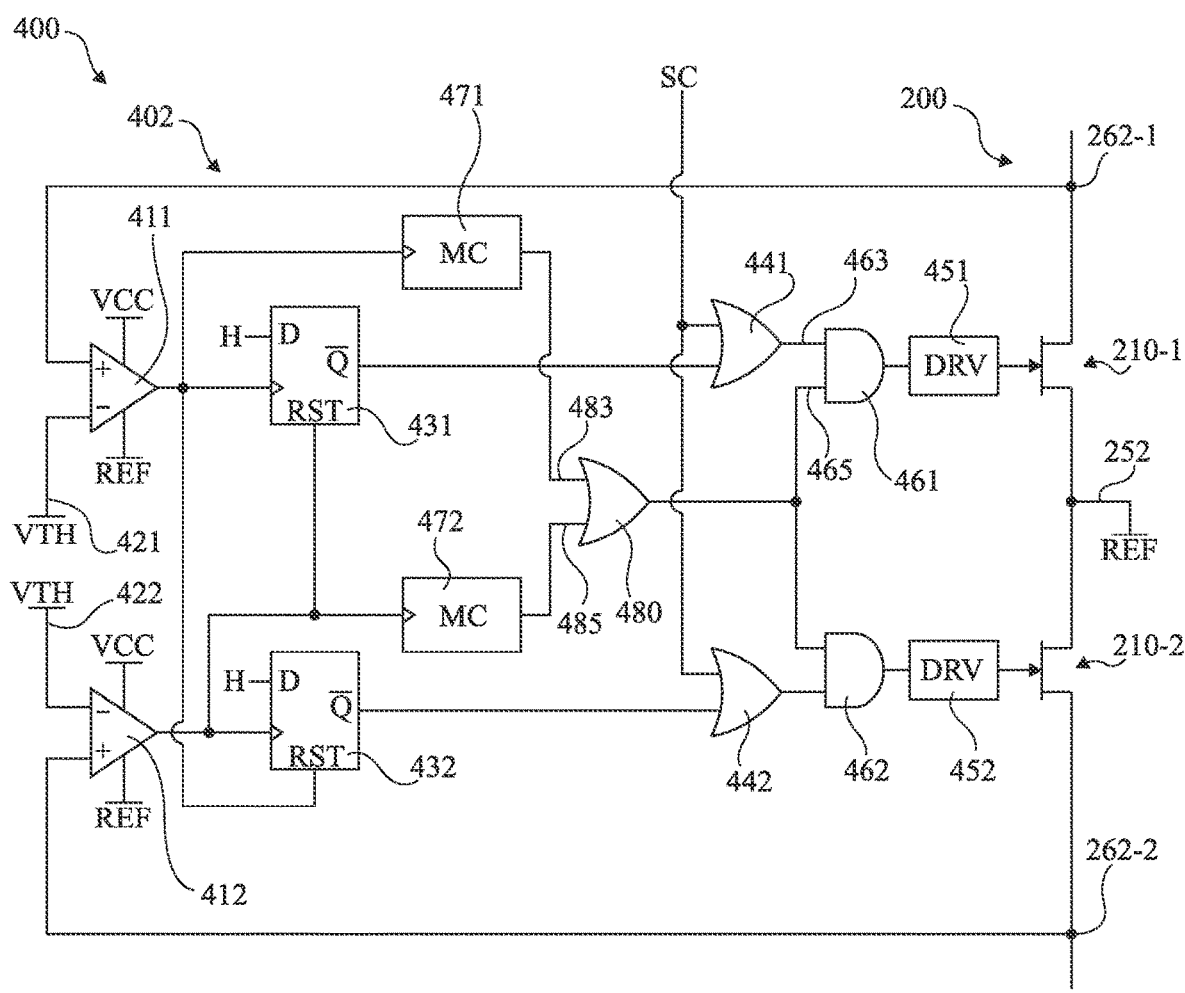
FIG. 4 schematically shows an embodiment of a device comprising a control circuit and switches electrically in series controlled by the circuit.

FIG. 4 schematically shows an example of an embodiment of a device 400 comprising a control circuit 402 and switches 210-1 and 210-2 electrically in series controlled by circuit 402.

A converter such as described in relation with FIG. 1 may comprise a plurality of devices 400 identical or similar to the shown example. For each of these devices 400, the switches in series 210-1 and 210-2 thus preferably form a bidirectional switch 200 of the converter. For example, these bidirectional switches form the respective switches TA1H, TB1H, TA1L, and/or TB1L of a converter of the type of the converter 100 of FIG. 1. Each device 400 then receives a control signal SC, representative of a desired state of the concerned bidirectional switch. Control signals SC may be different for the different devices 400. For example, control signal SC corresponds to the signal SCH or SCL of the branch 150 of FIG. 2.

Preferably, the switches in series 210-1 and 210-2 of device 400 are identical or similar to switches 210-1 and 210-2 and bidirectional switch 200 is of the type described in relation with FIG. 3.

Preferably, control circuit 402 is monolithic. Monolithic circuit or device means that the circuit or the device is formed inside and on top of a same substrate, for example, a same semiconductor wafer portion. Such a monolithic circuit has, over a non-monolithic circuit, the advantage that it can be connected or coupled to a bidirectional switch, to an H-bridge branch, or to a monolithic H bridge, in a simpler and closer way, and thus less likely to be disturbed by noise.

Control circuit 402 may be comprised in an integrated circuit package (not shown). Integrated circuit package means a component, preferably tight, having areas of connection or pins of connection to electronic circuits external to the circuit, for example, to a printed circuit board PCB, jutting out of it.

Preferably, the integrated circuit package contains, in addition to control circuit 402, the entire device 400. The package may further contain a plurality of devices 400, for example, two devices 400 of a switching cell or four devices 400 of an H bridge. Device 400 may also be monolithic. A plurality of devices 400 may form a monolithic assembly. This enables to simplify the forming of a converter comprising such switching cells and/or H bridges.

Control circuit 402 is preferably referenced to the potential REF of a source terminal 252 common to switches 210-1 and 210-2, for example, such as that described in relation with FIG. 3. Circuit 402 may be powered with a voltage VCC referenced to potential REF (only shown for two comparators 411 and 412 of circuit 402). Voltage referenced to potential REF means that the difference between the potential of a node of application of this voltage and potential REF is equal to this voltage.

An advantage of the control circuit 402 referenced to potential REF is that no galvanic isolation is required in circuit 402, and that circuit 402 may be coupled to bidirectional switch 200 and to an element supplying control signal SC only. The implementation of the control of bidirectional switch 200 is then particularly simple.

Comparator 411 has an input, for example, non-inverting (+) coupled, preferably connected, to the drain terminal 262-1 of switch 210-1. Comparator 411 has another input, inverting (−) in this example, coupled, preferably connected, to a node 421 of application of a voltage VTH referenced to potential REF. In other words, comparator 411 receives the voltage across switch 210-1 and compares this received voltage with voltage VTH. More precisely, the voltage across switch 210-1 is here between the conduction terminals (the drain and the source) of switch 210-1.

Voltage VTH forms a voltage threshold. This threshold preferably has a fixed, that is, constant, and positive value. Thus, when the voltage across switch 210-1 switches from a positive voltage smaller than threshold VTH to a positive value greater than threshold VTH, that is, when this voltage crosses threshold voltage VTH, the state of comparator 411 switches. Comparator 411 may be formed of any circuit capable of detecting a crossing of threshold VTH by the voltage across switch 210-1.

Control circuit 402 further comprises a D-type flip-flop 431. D-type flip-flop means a flip-flop having a D data input, a non-inverted Q output (not shown in FIG. 4) and/or an inverted $\overline{Q}$ output, and a clock input. Flip-flop 431 further has an asynchronous RST reset input which, when it is activated, sets the non-inverted Q output to a low logic level and the inverted $\overline{Q}$ output to a high logic level.

The clock input of flip-flop 431 is coupled, preferably connected, to the output of comparator 411. Flip-flop 431 may then store each crossing of threshold VTH by the voltage across switch 210-1. For this purpose, as an example, the data input D receives a high logic level (H). Thus, a crossing of threshold VTH switches the inverted $\overline{Q}$ output to the low logic level. This low logic level is kept after the crossing of the threshold as long as the RST input is not activated. Flip-flop 431 may be replaced with any logic circuit adapted to storing a threshold crossing by comparator 411 and capable of being reset.

Control circuit 402 comprises a logic OR gate 441 having an input coupled, preferably connected, to the inverted $\overline{Q}$ output of flip-flop 431. Another input of logic OR gate 441 receives control signal SC.

Control circuit 402 comprises a driver circuit 451 (DRV) having an input coupled to the output of logic OR gate 441, via an AND logic gate 461 in the shown example. Optional logic AND gate 461 has an input 463 coupled or connected to the output of logic OR gate 441 and an output coupled to the input of driver circuit 451. In the absence of logic AND gate 461, the input of close control circuit 451 may be coupled in another way, or be connected, to the output of logic OR gate 441. Driver circuit 451 controls switch 210-1.

Thus, logic OR gate 441 and driver circuit 451 have the function, when the link between logic OR gate 441 and circuit 451 transmits the output logic level of logic OR gate 441, of:
  setting switch 210-1 to the conductive state when no crossing of threshold VTH by the voltage across switch 210-1 is stored by flip-flop 431; and
  applying control signal SC to switch 210-1 when a threshold crossing is stored by flip-flop 431.

Logic OR gate 441 and circuit 451 may be replaced with any logic circuit adapted to having this function.

Preferably, control circuit 402 comprises, in addition to comparator 412, a flip-flop 432, a logic OR gate 442, a driver circuit 452, and an optional logic AND gate 462, identical or similar respectively to comparator 411, to flip-flop 431, to logic OR gate 441, to driver circuit 451, and to the optional logic AND gate 461, arranged together identically or similarly. These elements are not described again in detail.

In this example, the non-inverting input (+) of comparator 412 is coupled, preferably connected, to the drain terminal 262-2 of switch 210-2. The inverting input (−) of comparator 412 is coupled to a node 422 of application of a voltage referenced to potential REF. This voltage is preferably equal to threshold VTH but may as a variant have a different value. Logic OR gate 442 receives control signal SC. Driver circuit 452 controls switch 210-2.

Thus, comparator 412, flip-flop 432, logic OR gate 442, and driver circuit 452 have, for switch 210-2, the same functions as comparator 411, flip-flop 431, logic OR gate 441, and driver circuit 451 for switch 210-1. Logic OR gate 442 and/or flip-flop 432 may be replaced in the same way as, respectively, logic OR gate 441 and/or flip-flop 431, by any other circuit capable of fulfilling the same functions, described hereabove.

Preferably, the RST input of flip-flop 431 is coupled, more preferably connected, to the output of comparator 412. Also, preferably, the RST input of flip-flop 432 is coupled, more preferably connected, to the output of comparator 411. In other words, preferably, for each of the two switches 210-1 and 210-2, the RST input of the flip-flop associated with this switch is coupled, more preferably connected, to the output of the comparator associated with the other one of the two switches 210-1 and 210-2. As a result, for each of the two switches 210-1 and 210-2, the crossing of the threshold by the voltage across this switch causes the resetting of the flip-flop storing the crossing of the threshold by the voltage across the other one of the two switches 210-1 and 210-2.

According to an embodiment, control circuit 402 further comprises a restartable monostable circuit (MC) 471. Monostable circuit 471 has a turn-on input coupled, preferably connected, to the output of comparator 411. Monostable circuit 471 may have its output coupled to an input 465 of logic AND gate 461, by a logic OR gate 480 in the shown example. Optional logic OR gate 480 has an output coupled, preferably connected, to the input 465 of logic AND gate 461 and an input 483 coupled, preferably connected, to the output of monostable circuit 471. Monostable circuit 471 may be of the type commercialized by Texas Instruments under trade name "NE555".

Control circuit 402 may also comprise a monostable circuit 472, preferably identical or similar to monostable circuit 471. Monostable circuit 472 has an input coupled, preferably connected, to the output of comparator 412 and an output coupled, preferably connected, to an input 485 of logic OR gate 480.

Figure 5:
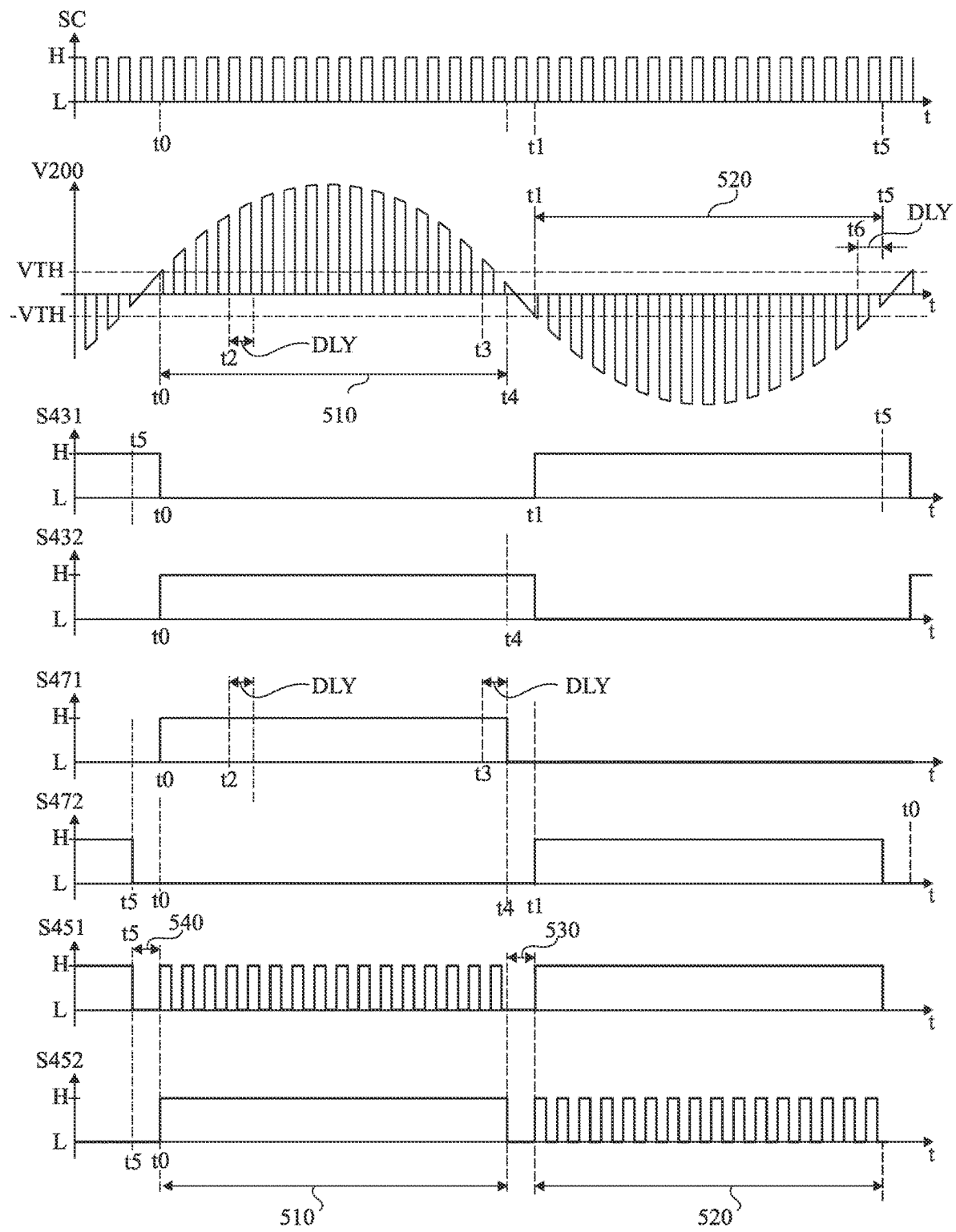
FIG. 5 shows, in simplified timing diagrams, an embodiment of a method implemented by the circuit of FIG. 4.

FIG. 5 shows, with simplified timing diagrams, an example of an embodiment of a method implemented by the control circuit 402 of FIG. 4. In particular, the method is here shown in the preferred case where the device 400 of FIG. 4 comprises monostable circuits 471 and 472, logic OR gate 480, and logic AND gates 461 and 462, and is used in a bridge branch of a converter such as the switching cell 150 of FIG. 2 receiving an AC voltage VAC. More precisely, there have been shown, according to time t, simplified curves:
  of the control signal SC of bidirectional switch 200;
  of a voltage V200 across bidirectional switch 200, that is, between drain terminals 262-1 and 262-2 (FIG. 4);
  of signals S431 and S432 delivered by respectively flip-flops 431 and 432 (FIG. 4) on their inverted $\overline{Q}$ outputs;
  signals S471 and S472 delivered by the respective monostable circuits 471 and 472 (FIG. 4); and
  of signals S451 and S452 applied to the respective switches 210-1, 210-2 by respective driver circuits 451 and 452 (FIG. 4). The high (H) and low (L) levels of signal S451 correspond to the respective on and off states of switch 210-1, and the high and low levels of signal S452 correspond to the respective on and off states of switch 210-2.

In this example, control signal SC is in square pulses between a high level (H) and a low level (L). The AC voltage VAC across the bridge branch is sinusoidal and has half-waves each defined by a time period between two consecutive sign changes of AC voltage VAC. For readability purposes, the ratio of the frequency of the square pulses of controls signal SC (switching frequency) to the frequency of AC voltage VAC is decreased with respect to the typical ratios between these frequencies.

When voltage V200 is positive (potential of terminal 262-1 greater than that of terminal 262-2), voltage V200 is present across switch 210-1 (possibly to within a voltage drop in a parasitic diode, not shown, of switch 210-2, located in parallel between the terminals of this switch). This occurs during positive halfwaves of AC voltage VAC (positive voltage VAC).

Similarly, when voltage V200 is negative, voltage V200 is present in absolute value across switch 210-2. This occurs during negative halfwaves of the AC voltage.

At a time t0, during each positive halfwave, voltage V200 crosses threshold VTH. This results in the setting to the low state of signal S431 and the resetting of flip-flop 432. Signal S432 switches to the high state, which causes the setting to the conductive state of switch 210-2. Thus, the crossing of threshold VTH by the voltage across switch 210-1 causes the conductive state of switch 210-2. A time period 510 starts at time t0, during which switch 210-2 is in the conductive state. More precisely, switch 210-2 remains in the conductive state during the entire period 510.

It could have been devised to leave switch 210-2 in the off state during positive halfwaves when switch 210-1 is conductive. This would have resulted in a voltage drop in the parasitic diode. It could also have been devised to leave switch 210-2 in the off state during positive halfwaves when switch 210-1 is off. As a result, potential reference REF would have been floating with respect to voltage V200, that is, no potential defined with respect to voltage V200 would be applied to the common source terminal.

As a comparison, the fact of providing the setting to the conductive state of switch 210-2 when the voltage across switch 210-1 crosses threshold VTH enables to improve both the efficiency and the reliability of the converter. This results from the fact that:
- the power losses resulting from voltage drops in the diodes are avoided or decreased, and
- various charge accumulations under the transistors T1 and T2 (FIG. 3) forming switches 210-1 and 210-2 are avoided or decreased. These charge accumulations are likely to modify the gate-source voltage thresholds beyond which the transistors are conductive and/or to increase the on-state resistance of the transistors, which adversely affects the efficiency and the reliability of the converter.

The above-mentioned parasitic diodes correspond, in practice, to the intrinsic diodes present in any field-effect transistor, based on silicon, on silicon carbide, GaN HEMT-type transistor. Transistors of these types have, due to the presence of this intrinsic diode, the possibility of naturally conducting in the reverse direction even when it is controlled to the off state. This degraded conduction mode (lightly conductive state) may be decreased but is inevitable in these technologies. Due to the turning on of switch 210-2 during positive halfwaves and to the turning on of transistor 201-1 during negative halfwaves, losses in these diodes are avoided or decreased.

In other technologies such as IGBT transistors, this intrinsic conduction mode is not present but diodes connected in antiparallel may be present. Here again, with the provided control mode, losses are avoided in these diodes.

For the threshold crossing by voltage V200 to occur, threshold VTH is smaller than the peak value of AC voltage VAC. Preferably, threshold VTH is smaller than 5% of the peak voltage, more preferably smaller than 1% of the peak voltage. As an example, threshold VTH is smaller than 30 V, for example, smaller than 4 V. The lower threshold VTH, the sooner period 510 starts at each positive halfwave, which increases the efficiency and the reliability.

Preferably, threshold VTH is greater than 0.1% of the peak voltage, more preferably greater than 0.5% of the peak voltage. As an example, threshold VTH is greater than 0.4 V, preferably greater than 2 V. Threshold VTH is thus greater than a voltage of switch 210-1 when the latter is in the conductive state. This enables to avoid erroneously detecting threshold crossings when switch 210-1 is in the conductive state.

In an embodiment where control circuit 402 (FIG. 4) comprises comparator 412, flip-flop 432, and logic OR gate 442, the crossing of threshold VTH at a time t1 by the voltage across switch 210-2 (corresponding to the crossing of threshold −VTH by voltage V200) causes the setting to the conductive state of switch 210-1 during a time period 520. This occurs in a way similar to that, described hereabove, causing the setting to the conductive state of switch 210-2 during period 510 at the crossing of threshold VTH by the voltage across switch 210-1.

In a variant, comparator 412, flip-flop 432, and logic OR gate 442 are not provided. In this variant, these elements may be replaced with any circuit capable of resetting flip-flop 431 after the storage of a threshold crossing, for example after a given delay to end period 510. In this variant, only switch 210-2 is set to the conductive state at the crossing of threshold VTH by the voltage across switch 210-1. As compared with this variant, the fact of providing to also set switch 210-1 to the conductive state at the crossing of threshold VTH by the voltage across switch 210-2 enables to improve the efficiency and the reliability of the converter.

Preferably, during the period 510 of conductive state of switch 210-2, control signal SC is applied to switch 210-1. When signal SC is at the high level, bidirectional switch 200 is conductive, and the voltage V200 across bidirectional switch 200 is, as compared with the peak value of the AC voltage, substantially zero. When signal SC is at the low level, bidirectional switch 200 is non-conductive, and the AC voltage VAC across the switching cell is present across bidirectional switch 200.

Thus, each square pulse of control signal SC causes a crossing of threshold VTH by the voltage across switch V210-1 at the time when the latter is turned off. A time t2 of one of these crossings is shown.

Preferably, in each positive halfwave, the period 510 started by the crossing of threshold VTH lasts for at least a central portion of the halfwave. In other words, period 510 extends over a plurality of cycles of control signal SC (switching cycle). This is not limiting and period 510 may be any period started by the crossing of the threshold and lasting, preferably, at least as long as the voltage across switch 210-1 is greater than the threshold. However, as compared with variants where switch 210-2 is set back to the off state when switch 210-1 is conductive at each cycle of control signal SC, the fact of providing for period 510 to extend over a plurality of cycles enables to benefit, with no interruption between the cycles, from the above-described reduction of the power losses resulting from voltage drops in the diodes.

In the preferred case where control circuit 402 (FIG. 4) comprises monostable circuit 471, the threshold crossing at time t0 causes the setting to the high level of the output signal S471 of monostable circuit 471. After this crossing, and after each of the next crossings of the considered positive halfwave, signal S471 remains in the high level for a duration DLY of a pulse of monostable circuit 471.

Preferably, duration DLY is greater than the cycle time of control signal SC and the monostable circuit is restartable, whereby signal S471 remains in the high level as long as the application of control signal SC causes threshold crossings, that is, voltage VAC is greater than threshold VTH at the time when switch 210-1 switches to the off state.

At a time t3, in the considered positive halfwave, a last threshold crossing occurs. Signal S471 switches to a low level at a time t4 located a predefined delay after time t3, formed by duration DLY.

In an embodiment, control circuit 402 comprises logic AND gate 462 (FIG. 4) and a link between the output of monostable circuit 471 and logic AND gate 462. In the shown example, this link is formed via logic OR gate 480, but this link may be a direct connection or any link adapted to transmitting a signal. Switch 210-2 is set to the off state from time t4. According to an advantage, it is avoided for bidirectional switch 200 to be shorted at the beginning of the next negative halfwave, before time t1. For this purpose, preferably, duration DLY is selected according to threshold VTH, to the peak value, and to the frequency of AC voltage VAC, so that time t4 is located before the end of the considered positive halfwave. For this purpose, as an example, duration DLY is in the range from 0.1% to 1% of the duration of a halfwave (two successive halfwaves), for example between 20 μs and 100 μs.

In another embodiment where control circuit 402 comprises logic AND gate 461 (FIG. 4), the application of control SC to switch 210-1 stops at time t4 from which switch 210-1 is in the off state.

Thus, in a combination of the two above embodiments, the application of control signal SC to switch 210-1 and the setting to the conductive state of switch 210-2 end at time t4. At time t3, the last threshold crossing during the positive halfwave is also the last threshold crossing during period 510. At a time period 530 located between successive periods 510 and 520, the two switches 210-1 and 210-2 are in the off state.

Similarly, in an embodiment where control circuit 402 comprises monostable circuit 472, the period 520 of application of control signal SC to switch 210-2 and of setting to the conductive state of switch 210-1 may end at a time t5 located a delay DLY after a time t6 of a last threshold crossing during period 520 by the voltage across switch 210-2. Between time t5 and the next time t0, at a time period 540 located between consecutive periods 520 and 510, the two switches 210-1 and 210-2 are in the off state.

In the shown example of the control circuit 402 of FIG. 4, logic OR gate 480 enables to obtain both periods 530 and periods 540. Periods 530 and 540 are interposed between periods 510 and 520. Periods 530 and 540 are each located astride two consecutive halfwaves.

The above-described embodiments are not limiting and, according to an embodiment where monostable circuits 471 and 472, logic AND gates 461 and 462, and logic OR gate 480 are omitted, periods 510 and 520 respectively extend from time t0 to time t1, and from time t1 to the next time t0. As compared with this embodiment, the provision of periods 530 and 540 enables to avoid a risk of temporarily shorting the switch, in a positive halfwave before time t0, and/or in a negative halfwave before time t1.

Figure 6:
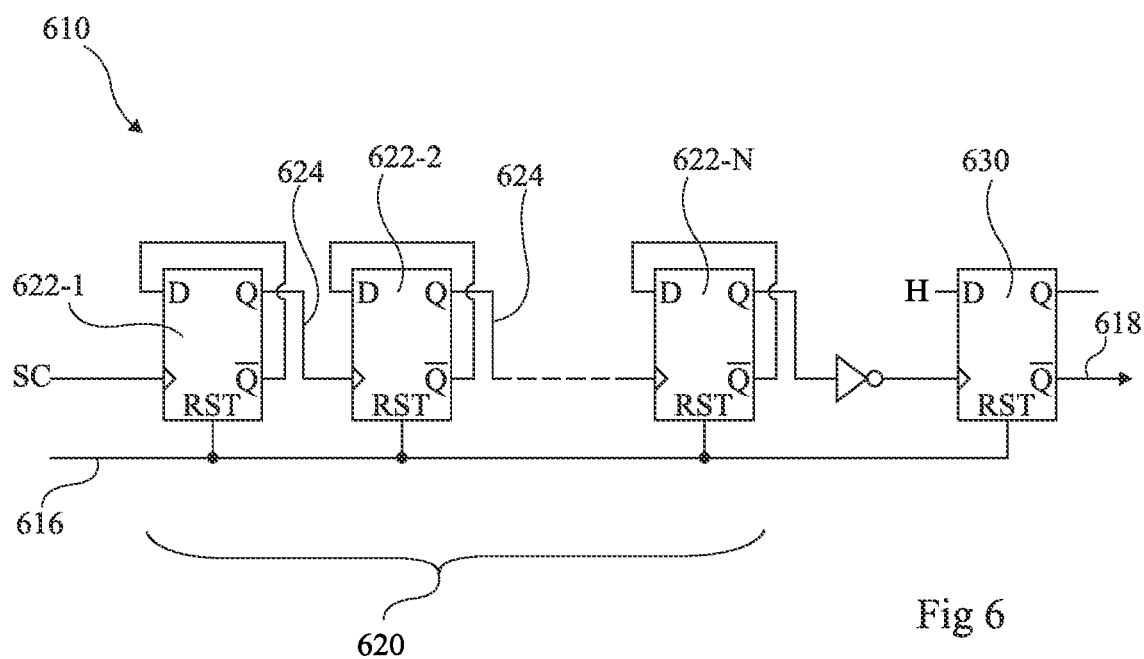
FIG. 6 schematically shows an example of an embodiment of a monostable circuit of the control circuit of FIG. 4.

FIG. 6 schematically shows an example of an embodiment of a monostable circuit 610 capable of forming the monostable circuit 471 and/or the monostable circuit 472 of the control circuit 402 of FIG. 4.

Monostable circuit 610 comprises a flip-flop counter 620. Flip-flop counter 620 is defined by an assembly of flip-flops 622-$i$ (622-1, 622 2, . . . , 622-N, i being an index varying from 1 to a number N of flip-flops 622 $i$) coupled in a chain, where:
- the chain is formed by links 624, preferably connections, between an output of each flip-flop 622-$i$ and a clock input of the next flip-flop;
- an end-of chain flip-flop 622-N has an output forming, or coupled or connected to, the output of flip-flop counter 620;
- a beginning-of-chain flip-flop 622-1 has a clock input forming, or coupled or connected to, a clock input of flip-flop counter 620; and
- in each flip-flop 622-$i$, another output is coupled, preferably connected, to a D data input of flip-flop 622-$i$.

In the shown example, the links 624 between flip-flops 622-$i$ are between the non-inverted Q outputs and the clock inputs, and the inverted $\overline{Q}$ outputs are coupled to the D inputs.

At each rising edge of the clock, flip-flop 622-1 changes level. The level changes of flip-flop 622-1 have a frequency which is half that received on the clock input of counter 620. Each flip-flop 622-$i$ changes level at a frequency which is half that of the previous flip-flop of the chain.

Preferably, the clock input receives square pulse control signal SC. As a variant, the clock input may receive any square pulse signal or clock signal. As compared with this variant, the fact of using square pulse control signal SC as a clock for counter 620 advantageously enables to provide an additional clock and, as described hereafter, to obtain for the obtained pulse duration of monostable circuit 610 to be equal to a predefined number of cycles of control signal SC.

Preferably, the flip-flops 622-$i$ of counter 620 have an asynchronous RST input for resetting the flip-flop when input RST receives a high level. The RST inputs of flip-flops 622-$i$ are coupled, preferably connected, to an input 616 of monostable circuit 610. As mentioned hereabove, the input 616 of monostable circuit 610 is coupled to the output of the concerned comparator 411 or 412 (FIG. 4).

In operation, at each threshold crossing, flip-flops 622-$i$ are reset. In other words, the counter is reset. This is triggered by a falling edge of control signal SC, which causes the blocking of bidirectional switch 200. As long as AC voltage VAC is greater than threshold VTH (FIG. 5), counter 620 is reset at each cycle of control signal SC.

From the last threshold crossing of the concerned halfwave (time t3 or t6 in FIG. 5), the counter is no longer reset at each cycle. In the shown example, the next rising edge of control signal SC causes a level change of all the flip-flops 622-$i$ in the chain and the output of counter 620 switches to the high level. Then, the level changes of flip-flops 622-$i$ take place. At the end of 2N 1 cycles of control signal SC, that is, the end of delay DLY, the output of counter 620 switches to the low level. A falling edge has thus been caused as the output of counter 620 at the end of delay DLY. As an example, the number N of flip-flops 622-$i$ of the counter is in the range from three to eight, for example, equal to four. The number N of flip-flops forms a parameter for setting delay DLY and is not limited to this specific example, and number N may be greater than eight, for example, equal to ten.

Preferably, monostable circuit 610 further comprises a D-type flip-flop 630 receiving a high logic level (H) on a D data input, and receiving the inverse of the output of counter 620 on its clock input. The inverted output of flip-flop 630 forms, or is coupled or connected to, the output 618 of monostable circuit 610. Flip-flop 630 has an asynchronous RST reset input coupled, preferably connected, to the input 616 of monostable circuit 610.

In operation, as long as AC voltage VAC is greater than threshold VTH (FIG. 5), flip-flop 630 is reset at each cycle of control signal SC, and the output of monostable circuit 610 is at 1. The falling edge at the output of counter 620 at the end of delay DLY causes the setting to the low state of the output of monostable circuit 610. If, after the end of this delay, counter 620 generates other edges at its output, the output of monostable circuit 610 remains at the low level. Thus, flip-flop 630 has the function of holding the high level of the output of monostable circuit 610 before the elapsing of delay DLY and of holding the low level of this output after the elapsing of delay DLY.

Various embodiments and variants have been described. Those skilled in the art will understand that certain features of these various embodiments and variants may be combined, and other variants will occur to those skilled in the art.

In particular, although a specific circuit 402 configured to implement the method embodiments described in relation with FIG. 5 has been described in relation with FIG. 5, circuit 402 may be formed of any circuit configured to implement at least one of the embodiments of the method. Such circuits are within the abilities of those skilled in the art based on the operation defined by the above-described embodiments of the method.

More particularly, for each of the above-described signals, the high and low logic levels may be exchanged by adapting the circuits generating and receiving the signal, in particular by adapting the types of the logic gates, the used outputs of the flip-flops and/or the clock edge directions of the flip-flops and/or the signals to be applied for the resets.

Finally, the practical implementation of the described embodiments and variants is within the abilities of those skilled in the art based on the functional indications given hereabove.

What is claimed is:

1. A circuit comprising first and second switches, wherein:
    said first and second switches are field-effect transistors having interconnected source terminals,
    one or a plurality of crossings of a first voltage threshold by a voltage across the first switch cause a conductive state of the second switch,
    one or a plurality of crossings of a second voltage threshold by a voltage across the second switch cause a conductive state of the first switch; and
    control signals of said first and second switches are provided by a control circuit, wherein a supply voltage of the control circuit is referenced at a potential of the interconnected source terminals of said first and second switches.

2. Circuit according to claim 1, wherein first periods of application of a square pulse control signal to the first switch and of conductive state of the second switch start by said crossings.

3. Circuit according to claim 2, wherein each square pulse of the control signal causes another crossing of the voltage threshold by the voltage across the first switch, and each first period ends a predefined delay after a last one of said other crossings located in the first period.

4. Circuit according to claim 1, wherein said conductive states of the second and first transistors short their respective intrinsic diodes.

5. Circuit according to claim 1, wherein each transistor is associated with a diode in antiparallel shorted during said conductive states.

6. Circuit according to claim 1, wherein second periods of application of a square pulse control signal to the second switch and of conductive state of the first switch start by said crossings of the second threshold.

7. Circuit according to claim 6, wherein each square pulse of the control signal causes another crossing of the second threshold by the voltage across the second switch, and each second period ends a predefined delay after a last one of said other crossings of the second threshold located in the second period.

8. Circuit according to claim 6, comprising, between the first periods and the second periods, third periods where the two switches are set to the off state.

9. Circuit according to claim 1, wherein said voltages across the first and second switches are referenced to their interconnected source terminals, and the crossings are switchings from absolute values smaller than the first and second respective voltage thresholds to greater absolute values, said first and second threshold being preferably of same value.

10. Circuit according to claim 9, wherein the first and second switches comprise field-effect transistors of GaN HEMT type.

11. Circuit according to claim 1, the circuit comprising:
    a first comparator receiving said voltage across the first switch and said first voltage threshold, and a logic circuit adapted to storing said one or a plurality of crossings and coupled to the comparator output; and
    a second comparator receiving said voltage across the second switch and said second voltage threshold, and an additional logic circuit adapted to storing one or a plurality of additional crossings and coupled to the output of the second comparator.

12. Circuit according to claim 11, comprising:
    a first monostable circuit having an input coupled to the output of said first comparator; and
    a second additional monostable circuit having an input coupled to the output of said second comparator.

13. Circuit according to claim 12, wherein the first monostable circuit comprises a flip-flop counter configured to receive the square pulse control signal on a clock input.

14. Monolithic device comprising the circuit according to claim 11 and the first and second switches.

15. Switched-mode converter configured to receive and/or deliver an AC voltage, comprising one or a plurality of the circuits according to claim 11.

16. Switched-mode converter configured to receive and/or to deliver an AC voltage, comprising the device according to claim 14.

17. A method of controlling first and second switches, the method comprising:
    providing control signals of said first and second switches by a control circuit, wherein said first and second switches are field-effect transistors having interconnected source terminals, and a supply voltage of the control circuit is referenced to a potential of the interconnected source terminals of the first and second switches;
    when a voltage across the first switch has one or a plurality of crossings of a first voltage threshold, causing, via the control signals, a conductive state of the second switch, and
    when a voltage across the second switch has one or a plurality of crossings of a second voltage threshold, causing, via the control signals, a conductive state of the first switch.

* * * * *